United States Patent
Yu et al.

(10) Patent No.: US 8,803,306 B1
(45) Date of Patent: Aug. 12, 2014

(54) FAN-OUT PACKAGE STRUCTURE AND METHODS FOR FORMING THE SAME

(71) Applicant: Taiwan Semiconductor Manufacturing Company, Ltd., Hsin-Chu (TW)

(72) Inventors: Chen-Hua Yu, Hsin-Chu (TW); Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/896,889

(22) Filed: May 17, 2013

Related U.S. Application Data

(60) Provisional application No. 61/754,362, filed on Jan. 18, 2013.

(51) Int. Cl.
*H01L 23/02* (2006.01)

(52) U.S. Cl.
USPC ............ 257/686; 257/690; 257/777; 438/109

(58) Field of Classification Search
USPC .................. 257/686, 690, 723, 777
See application file for complete search history.

(56) References Cited

U.S. PATENT DOCUMENTS

| | | | | |
|---|---|---|---|---|
| 8,098,508 | B2* | 1/2012 | Janzen | 365/63 |
| 8,362,602 | B2* | 1/2013 | Sasaki et al. | 257/686 |
| 8,513,795 | B2* | 8/2013 | Yang et al. | 257/686 |
| 2013/0119527 | A1* | 5/2013 | Luo et al. | 257/690 |
| 2013/0119528 | A1* | 5/2013 | Groothuis et al. | 257/690 |

* cited by examiner

*Primary Examiner* — Roy Potter
(74) *Attorney, Agent, or Firm* — Slater and Matsil, L.L.P.

(57) ABSTRACT

A package includes a device die including a first plurality of metal pillars at a top surface of the device die. The package further includes a die stack including a plurality of dies bonded together, and a second plurality of metal pillars at a top surface of the die stack. A polymer region includes first portions encircling the device die and the die stack, wherein a bottom surface of the polymer region is substantially level with a bottom surface of the device die and a bottom surface of the die stack. A top surface of the polymer region is level with top ends of the first plurality of metal pillars and top ends of the second plurality of metal pillars. Redistribution lines are formed over and electrically coupled to the first and the second plurality of metal pillars.

20 Claims, 7 Drawing Sheets

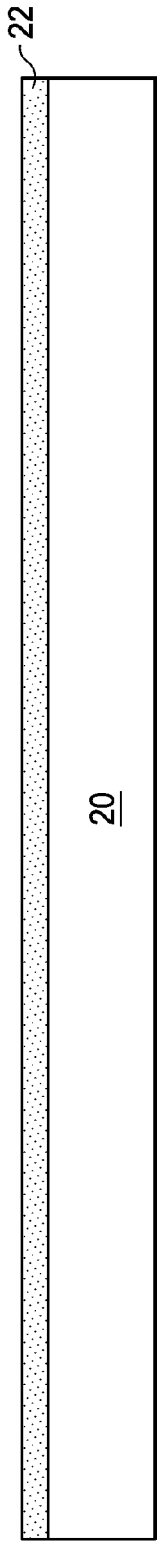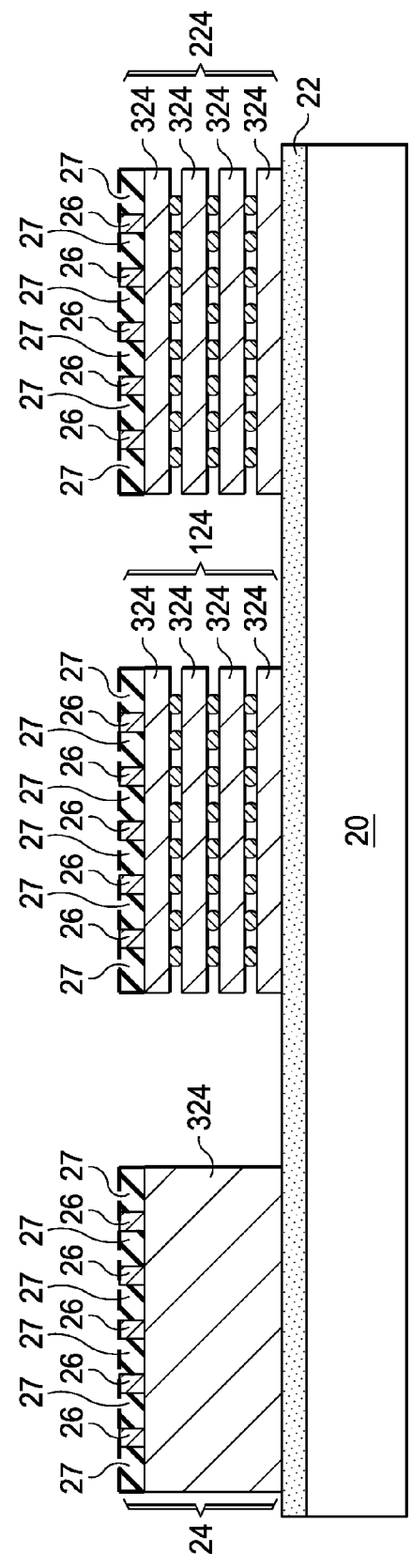

FAN-OUT PACKAGE STRUCTURE AND METHODS FOR FORMING THE SAME

This application claims the benefit of the following provisionally filed U.S. patent application: Application Ser. No. 61/754,362, filed Jan. 18, 2013, and entitled "Fan-Out Package Structure and Methods for Forming the Same," which application is hereby incorporated herein by reference.

BACKGROUND

In integrated circuit applications, more and more functions are integrated into products. For example, different functional elements such as 3G video elements, WiFi elements, Bluetooth elements, and audio/video elements may need to be integrated together to form an application.

In conventional integration schemes, different components are bonded to an interposer, which is further bonded to a package substrate. For example, in mobile applications, a power management integrated circuit die, a transceiver die, and a multi-layer ceramic capacitor may be bonded using this scheme. The resulting package is typically very thick and large in area.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 8 include cross-sectional views of intermediate stages in the manufacturing of a fan-out package structure in accordance with some exemplary embodiments, wherein a fan-out package structure is built from molded devices.

DETAILED DESCRIPTION OF ILLUSTRATIVE EMBODIMENTS

Figure 2B:
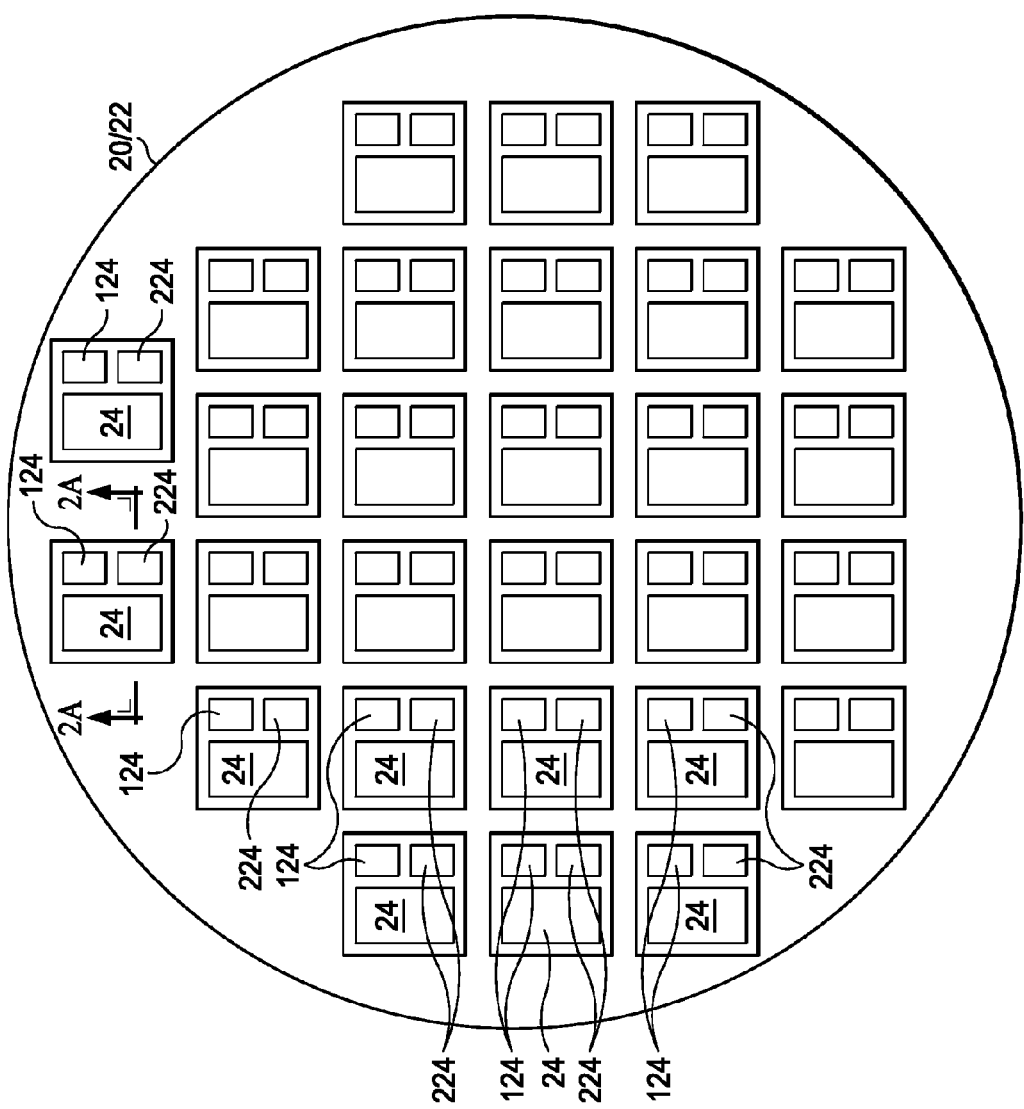

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A fan-out package structure and the methods of forming the same are provided in accordance with various exemplary embodiments. The intermediate stages of forming the fan-out package structure are illustrated. The variations of the embodiments are discussed. Throughout the various views and illustrative embodiments, like reference numbers are used to designate like elements.

FIGS. 1 through 8 include cross-sectional views of intermediate stages in the manufacturing of a fan-out structure in accordance with some exemplary embodiments. FIG. 1 illustrates carrier 20, and adhesive layer 22 on carrier 20. Carrier 20 may be a glass carrier, a ceramic carrier, or the like. Adhesive layer 22 may be formed of an adhesive such as an Ultra-Violet (UV) glue.

FIG. 2 illustrates the placement of device die(s) 24 and die stacks 124 and 224. Device die 24 and die stacks 124 and 224 are placed over carrier 20. In some embodiments, device die 24 and the die stacks 124 and 224 are attached to adhesive layer 22, which is adhered to carrier 20. Device die 24 may be a logic device die including logic transistors therein. In some exemplary embodiments, device die 24 is a Central Processing Unit (CPU) die. In other embodiments, device die 24 is a Graphics Processing Unit (GPU) die. Device die 24 may include a semiconductor substrate and active devices (such as transistors, not shown) formed on a surface of the semiconductor substrate.

Each of die stacks 124 and 224 may include a plurality of memory dies 324 bonded together to form a memory stack. Die stacks 124 and 224 may include Dynamic Random Access Memory (DRAM) dies, Static Random Access Memory (SRAM) dies, or memory dies formed of other types of memories. In some embodiments, memory dies 324 are pre-bonded (for example, through solder bonding, direct metal-to-metal bonding, or the like) to form die stacks 124 and 224, and then the bonded die stacks 124 and 224 are placed over carrier 20. In some embodiments, die stacks 124 and 224 are formed of a same type of memory (such as SRAM or DRAM). In alternative embodiments, die stacks 124 and 224 are the stacks of different types of memories.

Electrical connectors 26 are formed as the top portions of device die 24 and die stacks 124 and 224, and are electrically coupled to the devices in device die 24 and die stacks 124 and 224. In some embodiments, electrical connectors 26 include metal pillars 26 (such as copper pillars), which may be pre-formed before device die 24 and die stacks 124 and 224 are placed over carrier 20. Metal pillars 26 may be solder-free, and may comprise vertical sidewalls. In some embodiments, dielectric layers 27 are formed at the top surfaces of device die 24 and die stacks 124 and 224, with metal pillars 26 having at least lower portions, or entireties, in dielectric layer 27. The top surfaces of dielectric layers 27 may also be substantially level with the top ends of metal pillars 26. Dielectric layers 27 may comprise polyimide, polybenzoxazole (PBO), an oxide layer, a nitride layer, or multi-layers thereof. Alternatively, dielectric layers 27 are not formed, and metal pillars 26 protrude above the remaining portions of device die 24 and die stacks 124 and 224. In subsequently illustrated drawings, dielectric layers 27 are not illustrated, although they may also exist in some embodiments. The thicknesses of device die 24, die stacks 124 and 224, and the heights of metal pillars 26 are controlled so that the top ends of metal pillars 26 of device die 24 are substantially level with the top ends of metal pillars 26 of die stacks 124 and 224. Furthermore, since device die 24 and die stacks 124 and 224 are placed over carrier 20 (for example, on adhesive 22), the back surfaces of device die 24 and die stacks 124 and 224 are level with each other.

FIG. 2B illustrates a top view of the structure in FIG. 2A. The cross-sectional view in FIG. 2A is obtained from a plane crossing line 2A-2A in FIG. 2B. Furthermore, device die 24 and die stacks 124 and 224 are shown in the same plane in FIG. 2A for clarity, although they are not necessarily in the same plane, as shown in FIG. 2B, for example. In some embodiments, the placement of device die 24 and die stacks 124 and 224 is at the wafer level, and hence there are a plurality of device dies 24 and a plurality of die stacks 124 and 224 placed over carrier 20. FIG. 2B illustrates that carrier 20 has a round top-view shape. In alternative embodiments, carrier 20 may also have a rectangular top-view shape, and device die 24 and die stacks 124 and 224 may be laid out as an array. In FIG. 2B, the rectangles (not marked) encircling each groups of device die 24 and die stacks 124 and 224 mark the boundaries of the respective packages 48 (FIG. 7), which packages are formed in subsequent steps.

Figure 3:
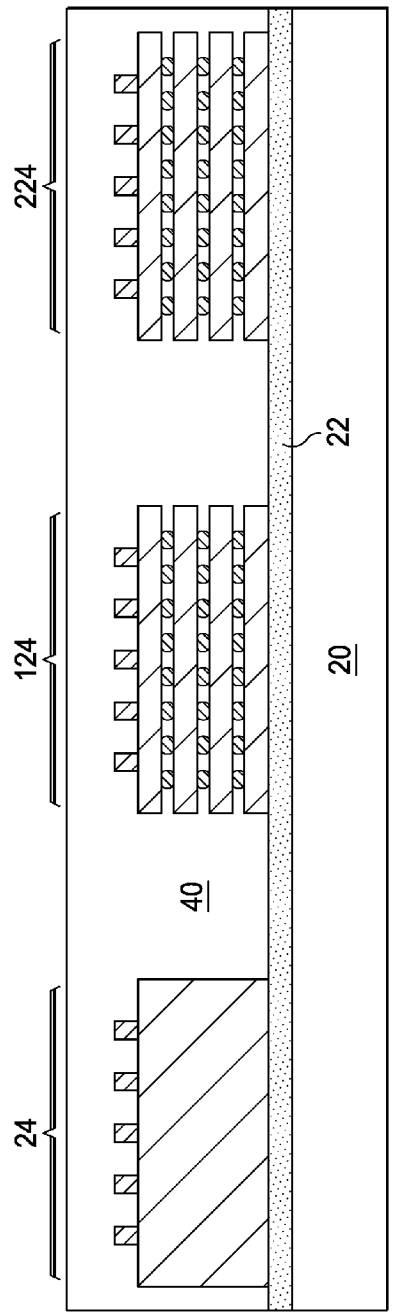

Referring to FIG. 3, molding material 40 is dispensed and molded on device die 24 and die stacks 124 and 224. Molding material 40 fills the gaps between device die 24 and die stacks 124 and 224, and may be in contact with adhesive layer 22. Furthermore, molding material 40 may be filled into the gaps between metal pillars 26 if dielectric layers 27 (FIG. 2) are not formed. Molding material 40 comprises a polymer in some embodiments. For example, molding material 40 may include a molding compound, a molding underfill, an epoxy, or a resin. The top surface of molding material 40 is higher than the top ends of metal pillars 26. The bottom surface of molding material 40 is level with the back surfaces of device die 24 and die stacks 124 and 224. After being dispensed, molding material 40 is cured.

Figure 4:
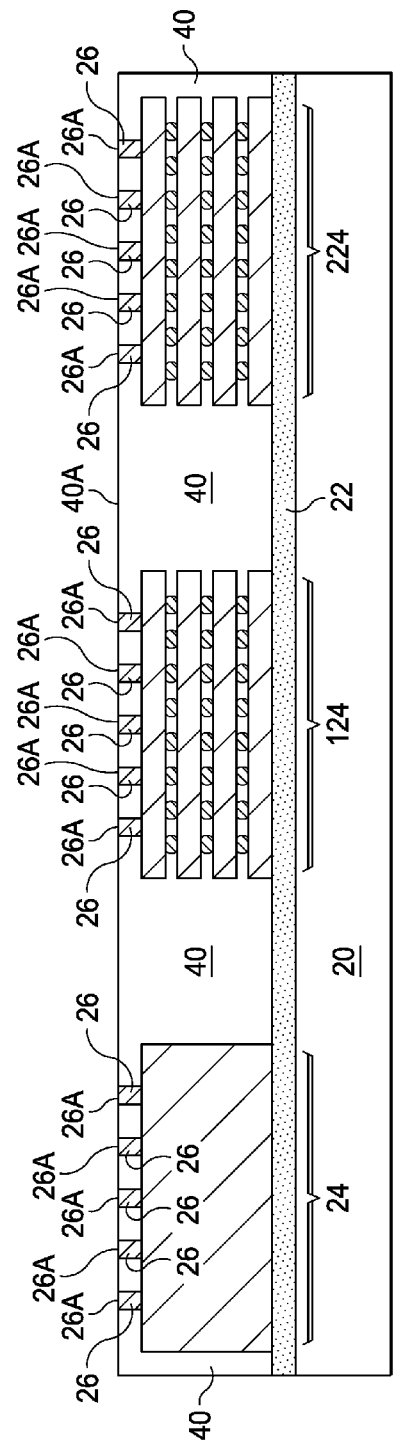

Next, a planarization step, which may be a grinding step or a Chemical Mechanical Polish (CMP), is performed to thin molding material 40, until metal pillars 26 are exposed. The resulting structure is shown in FIG. 4. The top ends 26A of metal pillars 26 in device die 24 and die stacks 124 and 224 are level with each other, and are level with top surface 40A of molding material 40. In some embodiments in which no dielectric layer 27 (FIG. 2) is formed, molding material 40 encircles, and is in contact with, each of metal pillars 26. In alternative embodiments in which dielectric layers 27 (FIG. 2) are formed, the top ends 26A of metal pillars 26 are level with each other, and are substantially level with the surfaces of dielectric layers 27 and top surface 40A of molding material 40.

Figure 5:
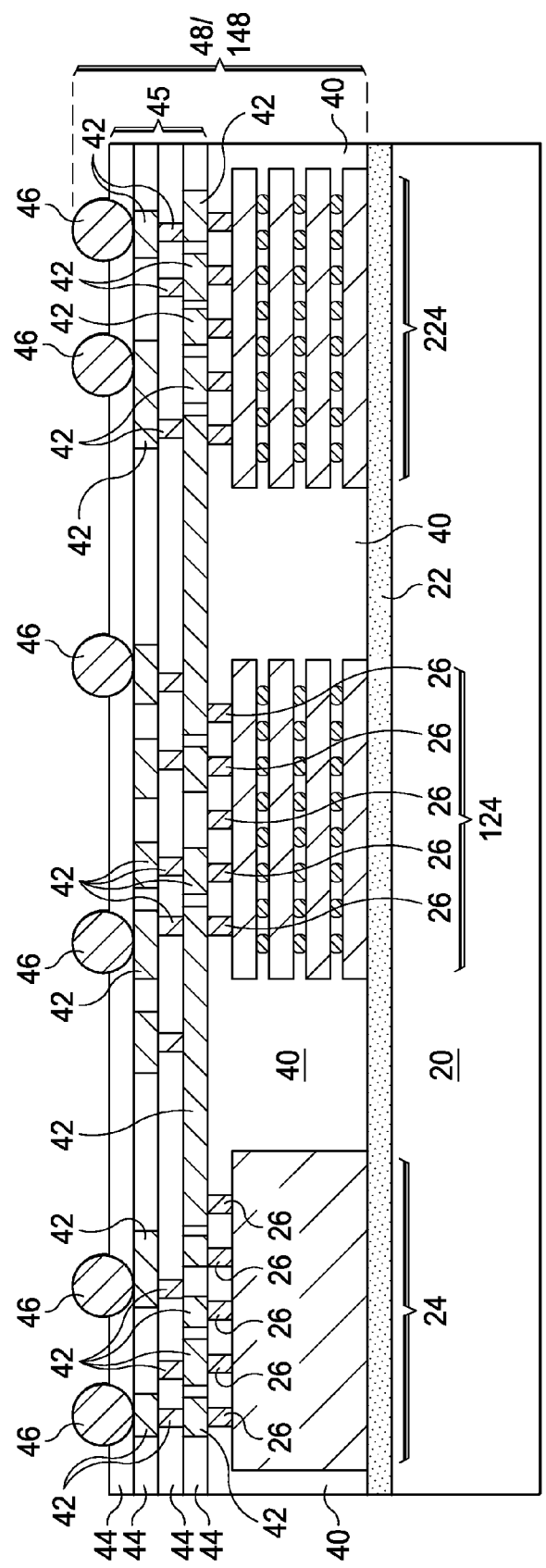

Next, referring to FIG. 5, Redistribution Lines (RDLs) 42 are formed over molding material 40. RDLs 42 are also electrically connected to, and may interconnect, metal pillars 26. RDLs 42 are formed in dielectric layers 44. There may be one, two, three, or more redistribution layer, each including a plurality of RDLs 42 that is at the same level. RDLs 42 further include vias that interconnect the RDLs in neighboring redistribution layers. The RDLs 42 in the bottom redistribution layer and the respective dielectric layer 44 have bottom surfaces in contact with the top ends of metal pillars 26 and the top surface of molding material 40. In some embodiments, RDLs 42 are formed by forming and patterning dielectric layers 44, and forming RDLs 42 in the openings in the patterned dielectric layers 44. In alternative embodiments, RDLs 42 are formed by depositing metal layers, patterning the metal layers, and filling the gaps between RDLs 42 with dielectric layers 44. In yet alternative embodiments, RDLs 42 and dielectric layers 44 are formed using damascene processes. RDLs 42 may comprise copper, nickel, palladium, aluminum, tungsten, or the like. Dielectric layers 44 may comprise photo-sensitive materials such as polyimide, PBO, or the like, which may be patterned without using additional photo resists. Dielectric layers 44 may also be formed of a non-organic material or materials such as oxides and/or nitrides. RLDs 42 and dielectric layers 44 are in combination referred to as interposer 45 throughout the description. In accordance with the embodiments of the present disclosure, interposer 45 is formed starting from molding material 40, device die 24, and die stacks 124 and 224, which in combination act as a wafer having enough thickness and strength to support the formation of interposer 45. As a result, interposer 45 may be very thin, for example, with a thickness smaller than about 50 μm without the concern that it may break during its formation and the subsequent handling.

FIG. 5 also illustrates the formation of electrical connectors 46 in accordance with some exemplary embodiments. The formation of connectors 46 may include placing solder balls on the exposed portions of RDLs 42, and then reflowing the solder balls. In alternative embodiments, the formation of connectors 46 includes performing a plating step to form solder regions over RDLs 42, and then reflowing the solder regions. Connectors 46 may also include metal pillars, or metal pillars and solder caps, which may also be formed through plating. Throughout the description, the combined structure including device die 24, die stacks 124 and 224, molding material 40, and the overlying RDLs 42 and dielectric layers 44 is referred to as package 48 hereinafter. Package 48 is a part of a wafer 148 that includes a plurality of packages 48.

Figure 6:
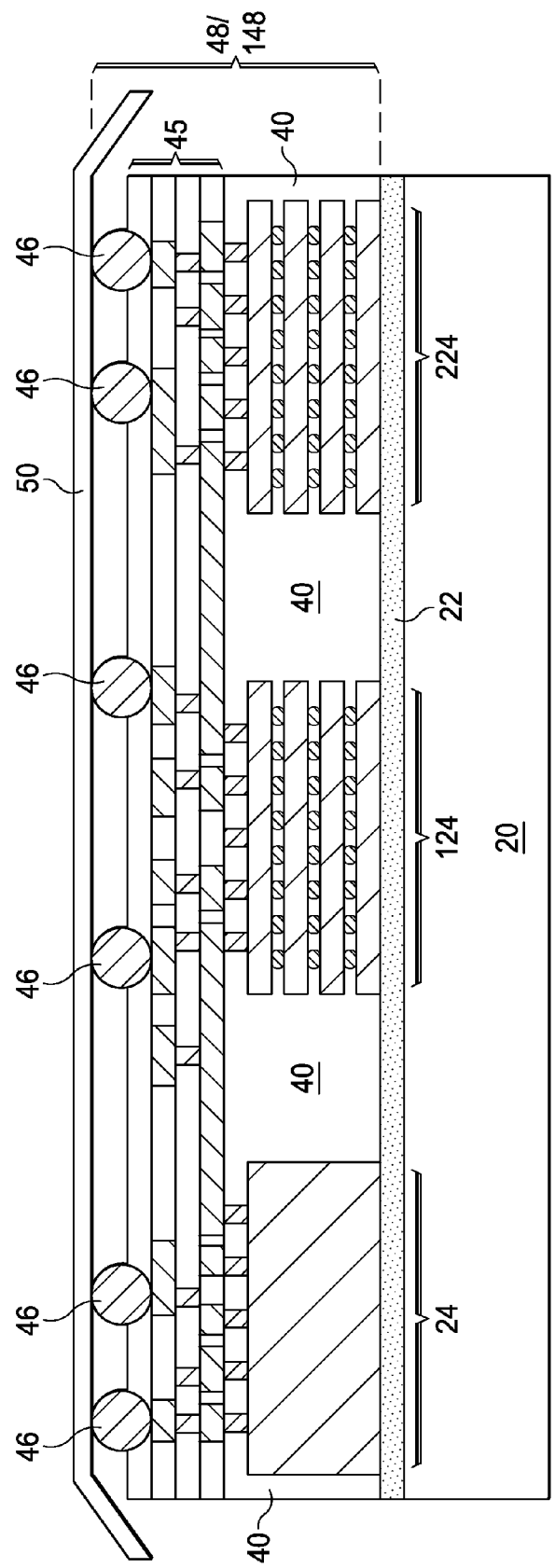

Referring to FIG. 6, dicing tap 50 is attached to package 48 and the respective wafer 148, wherein carrier 20 and dicing tape 50 are on the opposite sides of package 48. Next, carrier 20 is detached from package 48. Adhesive layer 22 is then removed. When adhesive layer 22 is formed of the UV glue, adhesive layer 22 may be exposed to UV light, so that adhesive layer 22 loses adhesion, and hence carrier 20 and adhesive layer 22 can be removed from package 48. The resulting structure is shown in FIG. 7.

Figure 7:
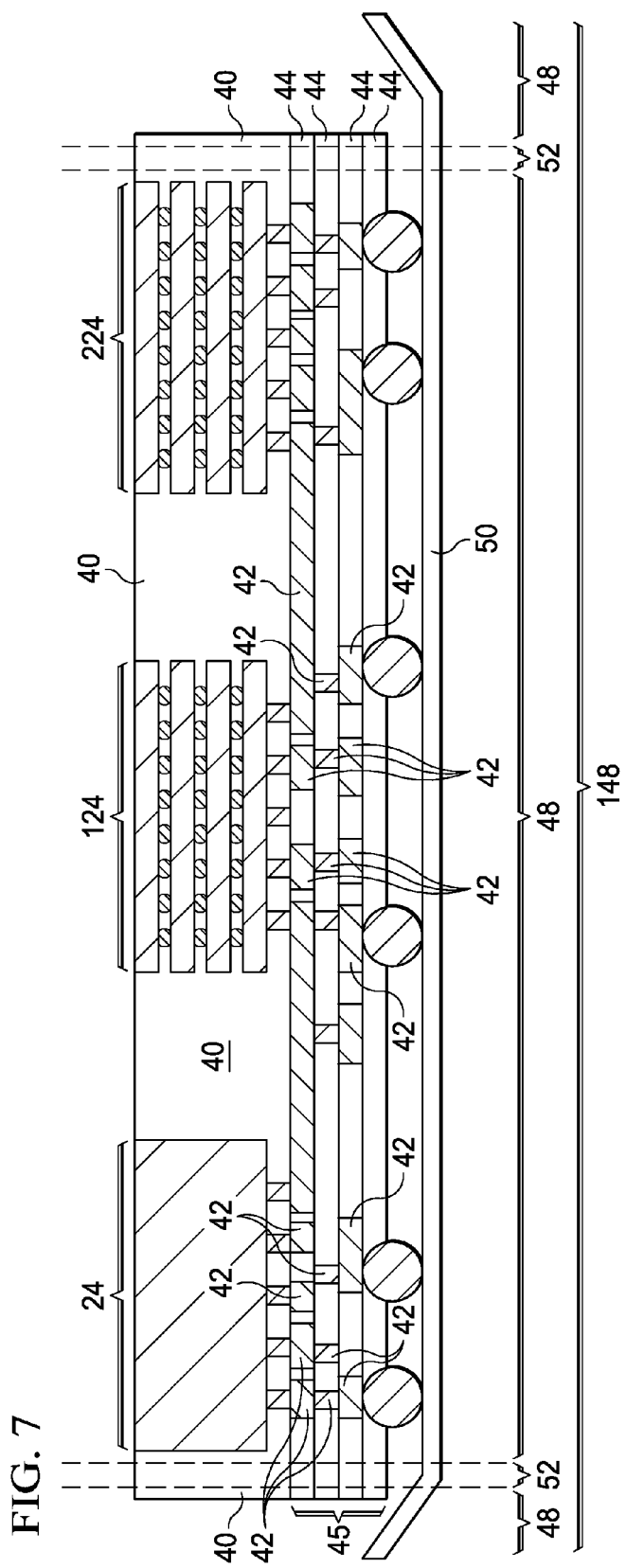

Further referring to FIG. 7, wafer 148 is sawed apart along scribe lines 52 to separate wafer 148 into a plurality of packages 48. Each of packages 48 may include device die 24 and die stacks 124 and 224, molding material 40, and a piece of interposer 45 that includes RDLs 42 and dielectric layers 44. As a result of the sawing, in the resulting packages 48, the edges of dielectric layers 44 are aligned to the respective edges of molding material 40.

Figure 8:
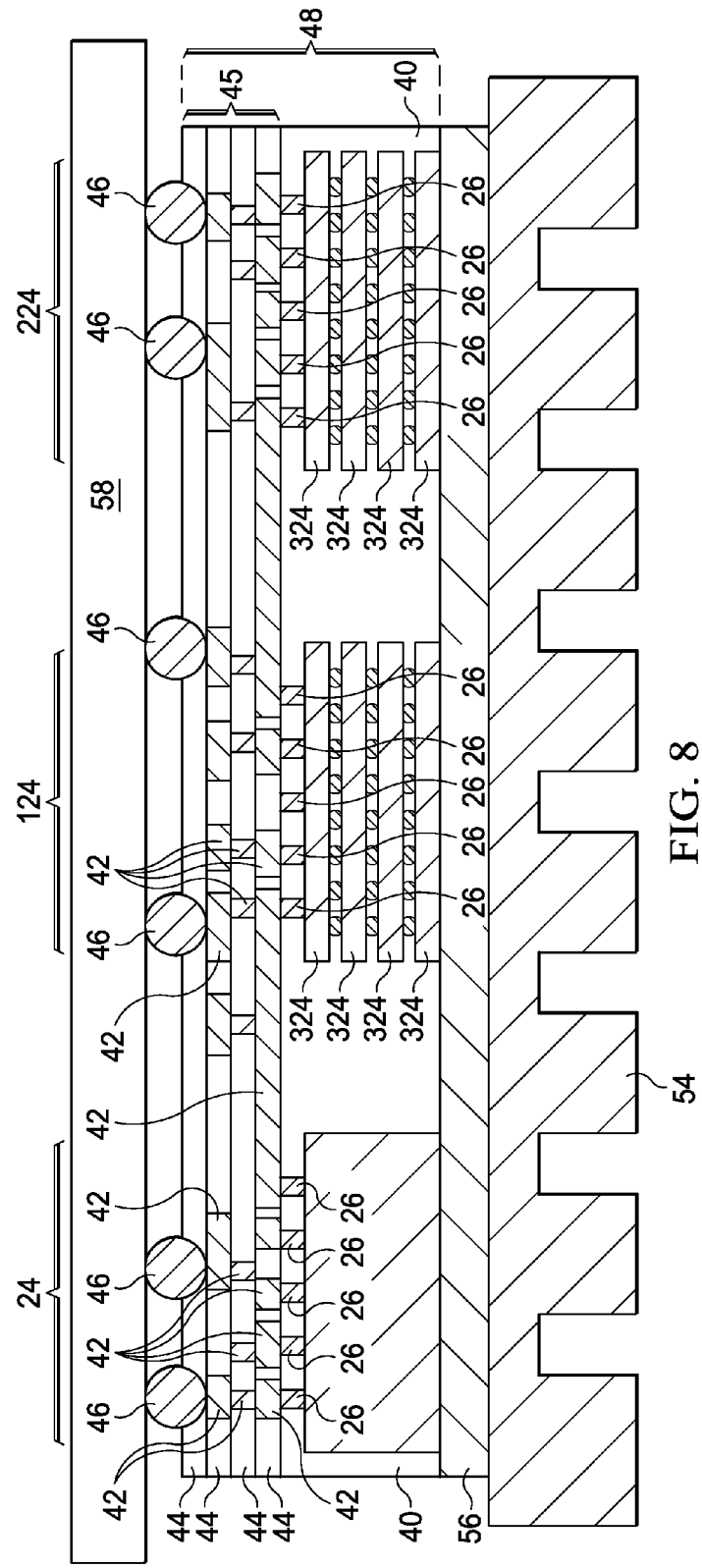

FIG. 8 illustrates the bonding and/or the attachment of package 48 to other package components. In some embodiments, connectors 46 are used to bond package 48 to another package component 58, which is a Printed Circuit Board (PCB) in some exemplary embodiments. In some embodiments, no additional interposer and package substrate are bonded between package 48 and PCB 58. Interposer 45, which is built in package 48, is used to electrically couple device die 24 and device stacks 124 and 224 to package component 58. In alternative embodiments, package 48 is bonded to an additional package substrate (not shown), which is further bonded to a PCB.

FIG. 8 also illustrates that the back surface of package 48 is attached to heat spreader 54. In some embodiments, thermal tape (or Thermal Interface Material (TIM)) 56, which has a thermal conductivity higher than the thermal conductivity of typical glues, is used to attach heat spreader 54 to package 48. Accordingly, the heat generated in device die 24 and device stacks 124 and 224 may be dissipated to heat spreader 54.

In accordance with the embodiments of the present disclosure, interposer 45 is built over the device die and device stacks after the device die and device stacks are molded. This is different from the conventional interposers that are manufactured first, and then bonded with device dies and/or device stacks. In the process for forming the packages in accordance with some embodiments, a molding material, a device die, and/or a device stack act as the carrier for forming interposer 45. Since interposer 45 does not need to be separated from the carrier (the molding compound and the dies molded therein), it can be made very thin without the concern that it may break in the subsequent handling. The thickness of the resulting package is hence significantly reduced.

In accordance with some embodiments, a package includes a device die including a first plurality of metal pillars at a top surface of the device die. The package further includes a die stack including a plurality of dies bonded together, and a second plurality of metal pillars at a top surface of the die stack. A polymer region includes first portions encircling the device die and the die stack, wherein a bottom surface of the polymer region is substantially level with a bottom surface of the device die and a bottom surface of the die stack. A top surface of the polymer region is level with top ends of the first plurality of metal pillars and top ends of the second plurality of metal pillars. Redistribution lines are formed over and electrically coupled to the first and the second plurality of metal pillars.

In accordance with other embodiments, a package includes a device die including a first plurality of metal pillars at a top surface of the device die. The package further includes a die stack, which includes a plurality of dies bonded together, and a second plurality of metal pillars at a top surface of the die stack. A polymer region molds the device die and the die stack therein, wherein a top surface of the polymer region, top ends of the first plurality of metal pillars, and top ends of the second plurality of metal pillars form a first planar surface. A dielectric layer is disposed over the polymer region, wherein edges of the dielectric layer are aligned to respective edges of the polymer region. Redistribution lines are disposed in the dielectric layer. The redistribution lines are electrically coupled to the first and the second plurality of metal pillars, and wherein bottom surfaces of the redistribution lines and the dielectric layer form a second planar surface in contact with the first planar surface.

In accordance with yet other embodiments, a method includes placing a device die over a carrier, wherein the device die includes a first plurality of metal pillars. A die stack is placed over the carrier, wherein the die stack includes a second plurality of metal pillars. A polymer is dispensed to mold the device die and the die stack therein. A planarization is performed on the polymer until the first and the second plurality of metal pillars are exposed. A plurality of redistribution lines is formed over the device die and the die stack. The plurality of redistribution lines is electrically coupled to the first and the second plurality of metal pillars.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
a device die comprising a first plurality of metal pillars at a top surface of the device die;
a die stack comprising:
a plurality of dies bonded together; and
a second plurality of metal pillars at a top surface of the die stack;
a polymer region comprising first portions encircling the device die and the die stack, wherein a bottom surface of the polymer region is substantially level with a bottom surface of the device die and a bottom surface of the die stack, and wherein a top surface of the polymer region is level with top ends of the first plurality of metal pillars and top ends of the second plurality of metal pillars; and
redistribution lines over and electrically coupled to the first and the second plurality of metal pillars.

2. The package of claim 1 further comprising a dielectric layer, with the redistribution lines in the dielectric layer, wherein a bottom surface of the dielectric layer is level with bottom surfaces of the redistribution lines, and wherein the bottom surface of the dielectric layer is in contact with the top surface of the polymer region.

3. The package of claim 2, wherein the dielectric layer comprises a photo-sensitive material.

4. The package of claim 2, wherein the polymer region comprises a second portion extending into spaces between the first plurality of metal pillars, and wherein the second portion comprises a top surface in contact with the dielectric layer.

5. The package of claim 4, wherein the second portion of the polymer region is further in contact with each of the first plurality of metal pillars.

6. The package of claim 1, wherein die stack comprises a plurality of memory dies.

7. The package of claim 1 further comprising an additional dielectric layer as a top portion of the device die, wherein the first plurality of metal pillars is in the additional dielectric layer, with a top surface of the additional dielectric layer level with top ends of the first plurality of metal pillars, and wherein edges of the additional dielectric layer are aligned to respective edges of a bottom portion of the device die.

8. The package of claim 1 wherein all dielectric layers in the package and over the polymer region have a total thickness smaller than about 50 μm.

9. A package comprising:
a device die comprising a first plurality of metal pillars at a top surface of the device die;
a die stack comprising:
a plurality of dies bonded together; and
a second plurality of metal pillars at a top surface of the die stack;
a polymer region molding the device die and the die stack therein, wherein a top surface of the polymer region, top ends of the first plurality of metal pillars, and top ends of the second plurality of metal pillars form a first planar surface;
a dielectric layer over the polymer region, wherein edges of the dielectric layer are aligned to respective edges of the polymer region; and
redistribution lines in the dielectric layer, wherein the redistribution lines are electrically coupled to the first and the second plurality of metal pillars, and wherein bottom surfaces of the redistribution lines and the dielectric layer form a second planar surface in contact with the first planar surface.

10. The package of claim 9, wherein the polymer region comprises a molding compound.

11. The package of claim 9, wherein the dielectric layer comprises a photo-sensitive material.

12. The package of claim 9, wherein a bottom surface of the device die is level with a bottom surface of the polymer region and a bottom surface of the die stack.

13. The package of claim 9 further comprising solder regions electrically coupled to the first and the second plurality of metal pillars, wherein the solder regions are bonded to a Printed Circuit Board (PCB), and wherein the PCB and the device die are on opposite sides of the dielectric layer.

14. The package of claim 9, wherein the polymer region extends into first spaces between the first plurality of metal pillars and second spaces between the second plurality of metal pillars.

15. The package of claim 14 further comprising an additional dielectric layer as a top portion of the device die, wherein the first plurality of metal pillars is in the additional dielectric layer, with a top surface of the additional dielectric layer level with top ends of the first plurality of metal pillars, and wherein edges of the additional dielectric layer are aligned to respective edges of a bottom portion of the device die.

16. A method comprising:
placing a device die over a carrier, wherein the device die comprises a first plurality of metal pillars;
placing a die stack over the carrier, wherein the die stack comprises a second plurality of metal pillars;
dispensing a polymer to mold the device die and the die stack therein;
performing a planarization on the polymer until the first and the second plurality of metal pillars are exposed; and
forming a plurality of redistribution lines over the device die and the die stack, wherein the plurality of redistribution lines is electrically coupled to the first and the second plurality of metal pillars.

17. The method of claim 16 further comprising forming a plurality of redistribution layers over the device die and the die stack, wherein the plurality of redistribution lines is in one of the plurality of redistribution layers.

18. The method of claim 16 further comprising:
after the plurality of redistribution lines is formed, removing the carrier;
sawing a wafer comprising the polymer, the device die, and the die stack into a plurality of packages, wherein one of the plurality of packages comprises the device die and the die stack; and
bonding the one of the plurality of packages to a printed circuit board.

19. The method of claim 16 further comprising:
after the plurality of redistribution lines is formed, removing the carrier;
sawing a wafer comprising the polymer, the device die, and the die stack into a plurality of packages, wherein one of the plurality of packages comprises the device die and the die stack; and
attaching a heat sink underlying the device die and the die stack.

20. The method of claim 16 further comprising:
before the step of placing the die stack over the carrier, bonding a plurality of dies together to form the die stack.

* * * * *